US008785789B2

(12) United States Patent
Oh et al.

(10) Patent No.: US 8,785,789 B2
(45) Date of Patent: Jul. 22, 2014

(54) PRINTED CIRCUIT BOARD AND METHOD FOR MANUFACTURING THE SAME

(75) Inventors: Hueng Jae Oh, Gyunggi-do (KR); Boo Yang Jung, Gyunggi-do (KR); Dae Young Lee, Gyunggi-do (KR); Jin Won Choi, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 162 days.

(21) Appl. No.: 13/402,638

(22) Filed: Feb. 22, 2012

(65) Prior Publication Data
US 2013/0161085 A1 Jun. 27, 2013

(30) Foreign Application Priority Data

Dec. 22, 2011 (KR) .................. 10-2011-0140328

(51) Int. Cl.
*H05K 1/11* (2006.01)
*H01K 3/10* (2006.01)

(52) U.S. Cl.
USPC .................. 174/261; 174/267; 29/852

(58) Field of Classification Search
USPC .................. 174/261, 267; 29/852–853
See application file for complete search history.

(56) References Cited

U.S. PATENT DOCUMENTS 7,202,421 B2 * 4/2007 Sugiura .................. 174/267
2007/0166993 A1 * 7/2007 Lee et al. .................. 438/614

FOREIGN PATENT DOCUMENTS

| KR | 10-2001-0107767 | 12/2001 |
| TW | 200744174 A | 12/2007 |
| TW | I341019 A | 4/2011 |
| TW | 201124028 A | 7/2011 |

OTHER PUBLICATIONS

Office Action for Taiwanese Patent Application No. 101105323, dated Aug. 28, 2013, and an English summary provided by the applicant.

* cited by examiner

*Primary Examiner* — Jeremy C Norris
(74) *Attorney, Agent, or Firm* — Ladas & Parry, LLP

(57) ABSTRACT

Disclosed herein are a printed circuit board (PCB) and a method for manufacturing the same. The PCB includes a base substrate, a circuit layer formed on the base substrate and including a connection pad, a solder resist layer formed on an upper portion of the base substrate and having an opening exposing the connection pad, a metal post formed on upper portions of the connection pad and the solder resist layer and having a plurality of diameters, and a seed layer formed on the upper portion of the solder resist layer and inner walls of the opening along an interface of the metal post.

10 Claims, 10 Drawing Sheets

PRINTED CIRCUIT BOARD AND METHOD FOR MANUFACTURING THE SAME

CROSS REFERENCE TO RELATED APPLICATION

This application claims the benefit of Korean Patent Application No. 10-2011-0140328, filed on Dec. 22, 2011, entitled "Printed Circuit Board and Manufacturing Method Thereof", which is hereby incorporated by reference in its entirety into this application.

BACKGROUND OF THE INVENTION

1. Technical Field

The present invention relates to a printed circuit board and a method for manufacturing the same.

2. Description of the Related Art

With the development of the electronics industry, electronic components are increasingly required to have high performance, be multifunctional and have a smaller size. According to the trend, requirements for substrates used for surface-mounted components such as a system in package (SIP), a 3D package, and the like, to become highly integrated and thinner and have a fine circuit pattern have emerged.

In a surface mount technology for mounting external elements such as a semiconductor chip, and the like, a wire boning scheme and a flip chip bonding scheme are used to electrically connect the semiconductor chip and a printed circuit board (PCB). However, in the case of the wire bonding scheme, since the semiconductor chip is connected to the PCB by using a wire, the size of a module is increased, an additional process is required, and there is a limitation in implementing a fine pitch, so the flip chip bonding scheme is commonly used, instead.

According to the flip chip bonding scheme, bumps made of gold, solder, or any other metals and having a size ranging from tens to hundreds of um are formed on a semiconductor chip or a PCB on which a semiconductor chip is to be mounted, and a semiconductor chip is mounted on the PCB (See Korean Patent Laid Open Publication No. 2001-0107767).

However, as PCBs are becoming fine, an opening of a pad on which bumps are formed is reduced, causing problems such as a degradation of bonding strength between PCBs and bumps, a reduction in mounting stability, defective underfill, and the like.

SUMMARY OF THE INVENTION

The present invention has been made in an effort to provide a printed circuit board (PCB) having enhanced mounting stability of external elements, and a method for manufacturing the same.

The present invention has also been made in an effort to provide a PCB including a metal post having enhanced bonding strength, and a method for manufacturing the same.

The present invention has also been made in an effort to provide a PCB in which a formation of voids is prevented during an underfill process, and a method for manufacturing the same.

According to a preferred embodiment of the present invention, there is provided a printed circuit board (PCB) including: a base substrate; a circuit layer formed on the base substrate and including a connection pad; a solder resist layer formed on an upper portion of the base substrate and having an opening exposing the connection pad; a metal post formed on upper portions of the exposed connection pad and the solder resist layer and having a plurality of diameters; and a seed layer formed on the upper portion of the solder resist layer and inner walls of the opening along an interface of the metal post.

The metal post may include: a first post portion formed within the opening; a second post portion formed on upper portions of the first post portion and the solder resist layer; and a third post portion formed on an upper portion of the second post portion.

In the metal post, the diameter of the third post portion may be greater than that of the second portion.

In the metal post, the diameter of the third post portion may be smaller than that of the second portion.

The seed layer may be formed through electroless plating.

The metal post may be formed through electroplating.

According to another preferred embodiment of the present invention, there is provided a method for manufacturing a printed circuit board (PCB), including: preparing a base substrate on which a circuit layer including a connection pad is formed; forming a solder resist layer having a first opening exposing the connection pad on an upper portion of the base substrate; forming a first plated resist layer which has a second opening exposing the first opening and has a diameter greater than that of the first opening on an upper portion of the solder resist layer; forming a seed layer on an upper portion of the first plated resist layer, on an inner wall of the first opening, and on an inner wall of the second opening; forming a second plated resist layer which has a third opening exposing the first opening on an upper portion of the seed layer; plating the interior of the first through third openings to form a metal post; eliminating the second plated resist layer; eliminating the seed layer exposed through the elimination of the second plated resist layer; and eliminating the first plated resist layer exposed through the elimination of the seed layer.

In the forming of the second plated resist layer, the third opening may be formed to have a diameter greater than that of the second opening.

In the forming of the second plated resist layer, the third opening may be formed to have a diameter smaller than that of the second opening.

In the forming of the seed layer, the seed layer may be formed through electroless plating.

In the forming of the metal post, the metal post may be formed through electroplating.

The method may further include: planarizing the metal post after eliminating the second plated resist layer.

In the planarizing of the metal post, the metal post may be planarized through a polishing process.

DESCRIPTION OF THE PREFERRED EMBODIMENTS

Figure 1:
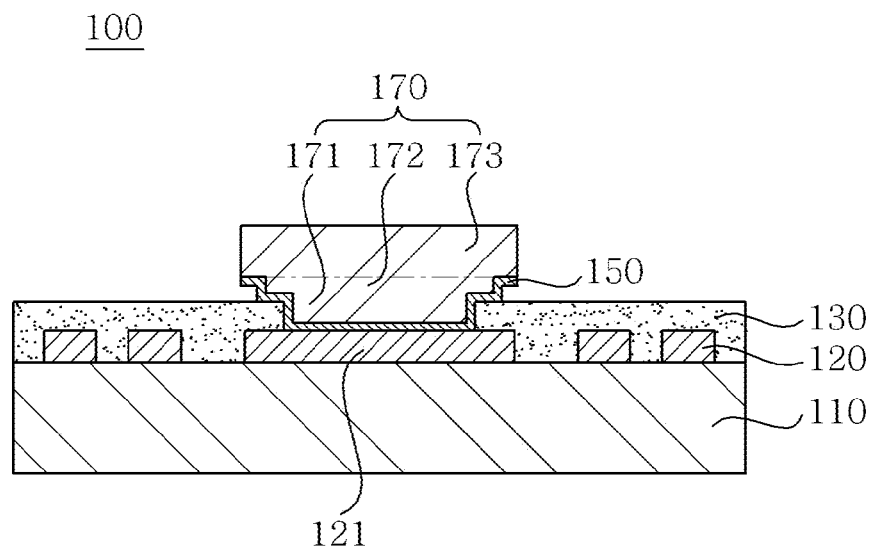
FIG. 1 is a cross-sectional view showing a printed circuit board according to a preferred embodiment of the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings.

Further, when it is determined that the detailed description of the known art related to the present invention may obscure the gist of the present invention, the detailed description thereof will be omitted. While terms such as "first," "second," etc., may be used to describe various components, such terms are used only to distinguish one component from another, and the components must not be limited to the above terms.

Hereinafter, a printed circuit board and a method for manufacturing the same according to preferred embodiments of the present invention will be described in detail with reference to the accompanying drawings.

FIG. 1 is a cross-sectional view showing a printed circuit board according to a preferred embodiment of the present invention.

With reference to FIG. 1, a printed circuit board (PCB) 100 may include a base substrate 110, a circuit layer 120, a solder resist layer 130, a seed layer 150, and a metal post 170.

The base substrate 110 may be, for example, a copper clad laminate (CCL). The CCL, which is a raw material plate used for manufacturing a package substrate, refers to a laminate formed by thinly coating copper on a solder resist layer. CCLs may include a glass/epoxy CCL, a heat-resistant CCL, paper/phenol CCL, a high frequency CCL, a flexible CCL (polyimide film), a composite CCL, and the like, according to purposes. Among them, the glass/epoxy CCL is commonly used in a double-sided package substrate and a multilayer package substrate.

The circuit layer 120 is formed on an upper portion of the base substrate 110. The circuit layer 120, configured to transfer an electrical signal, may include a circuit pattern, a via, and a connection pad. The circuit layer 120 may be made of copper, gold, silver, nickel, or the like, having excellent electrical conductivity. According to a preferred embodiment of the present invention, the circuit layer 120 may be formed on the outermost layer.

According to a preferred embodiment of the present invention, the circuit layer 120 is formed as a single layer on an upper portion of the base substrate 110, but the present invention is not limited thereto. Namely, multiple circuit layers may be formed on the base substrate 110. Also, a single circuit layer or multiple circuit layers may be formed on one surface or both surfaces of the base substrate 110.

The solder resist layer 130 may be formed on an upper portion of the circuit layer 120. In order to prevent the circuit layer 120 as the outermost layer from being damaged by soldering, or the like, using solder, the solder resist layer 130 may be formed on the upper portion of the circuit layer 120. The solder resist layer 130 may have an opening formed to allow a connection pad 121 of the circuit layer 120 to be exposed to the outside.

The metal post 170 may be formed on an upper portion of the seed layer 150. The metal post 170 may be formed by filling (or charging) the interior of the opening of the solder resist layer 130, which is formed to expose the connection pad 121, with an electrically conductive metal. For example, the metal post 170 may be made of metal such as copper, gold, silver, nickel, or the like, having excellent electrical conductivity. The metal post 170 may be formed on the upper portion of the seed layer 150 such that a lower portion thereof has a stair-like shape. Namely, the metal post 170 may be formed to have a plurality of diameters. The metal post 170 may include a first post portion 171, a second post portion 172, and a third post portion 173.

The first post portion 171 may be formed within the opening formed in the solder resist layer 130.

The second post portion 172 may be formed on an upper portion of the first post portion 171 and the solder resist layer 130.

The third post portion 173 may be formed on an upper portion of the second post portion 172.

In the metal post 170 formed thusly, at least one of the first post portion 171 to the third post portion 173 may have a diameter having a different size.

According to a preferred embodiment of the present invention, in the metal post 170, the diameter of the third post portion 173 may be greater than that of the second post portion 172.

The metal post 170 in which the third post portion 173 has a greater diameter than that of the second post portion 172 can improve mounting stability of an external element (not shown) such as a semiconductor element, or the like, mounted on an upper portion of the PCB 100. Also, since the second post portion 172 of the metal post 170 is formed on the upper portion of the solder resist layer 130, a bonding area between the metal post 170 and the solder resist layer 130 can be increased. Since the bonding area between the metal post 170 and the solder resist layer 130 is increased, bonding strength between the metal post 170 and the PCB 100 can be enhanced.

The seed layer 150 may be formed between upper portions of the solder resist layer 130 and the connection pad 121 and a lower portion of the metal post 170. The seed layer 150 may be formed on a lower surface of the first portion 171, the second post portion 172, and the third post portion 173 of the metal post 170. Thus, since the seed layer 150 is formed on the lower surface of the first portion 171, the second post portion 172, and the third post portion 173 of the metal post 170, the seed layer 150 may be formed to have steps like stairs.

In the PCB and the method for manufacturing the same according to a preferred embodiment of the present invention, since the diameter of the intermediate portion of the metal post is large, the bonding area between the metal post and the solder resist can be increased to enhance the bonding strength therebetween.

FIGS. 2 through 11 are cross-sectional views sequentially showing a method for manufacturing a PCB according to a preferred embodiment of the present invention.

Figure 2:
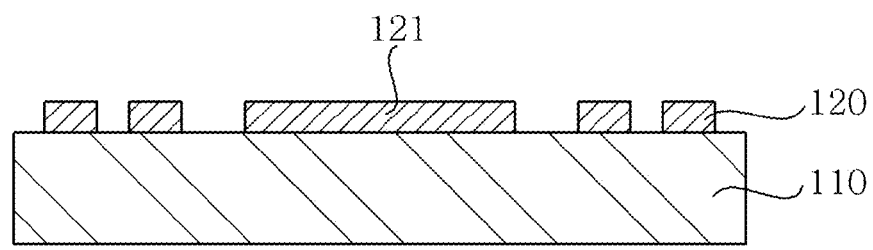
FIGS. 2 through 11 are cross-sectional views sequentially showing a method for manufacturing a PCB according to a preferred embodiment of the present invention.

With reference to FIG. 2, the base substrate 100 with the circuit layer 120 formed thereon may be provided.

The base substrate 110 may be, for example, a copper clad laminate (CCL). The CCL, which is a raw material plate used for manufacturing a package substrate, refers to a laminate formed by thinly coating copper on a solder resist layer. CCLs may include a glass/epoxy CCL, a heat-resistant CCL, paper/phenol CCL, a high frequency CCL, a flexible CCL (polyimide film), a composite CCL, and the like, according to purposes. Among them, the glass/epoxy CCL is commonly used for a double-sided package substrate and a multilayer package substrate.

The circuit layer 120 is formed at an upper portion of the base substrate 110. The circuit layer 120, configured to transfer an electrical signal, may include a circuit pattern, a via, and a connection pad. The circuit layer 120 may be made of copper, gold, silver, nickel, or the like, having excellent electrical conductivity. According to a preferred embodiment of the present invention, the circuit layer 120 may be formed on the outermost layer.

According to a preferred embodiment of the present invention, the circuit layer 120 is formed as a single layer on an upper portion of the base substrate 110, but the present invention is not limited thereto. Namely, multiple circuit layers may be formed on the base substrate 110. Also, a single circuit layer or multiple circuit layers may be formed on one surface or both surfaces of the base substrate 110.

Figure 3:
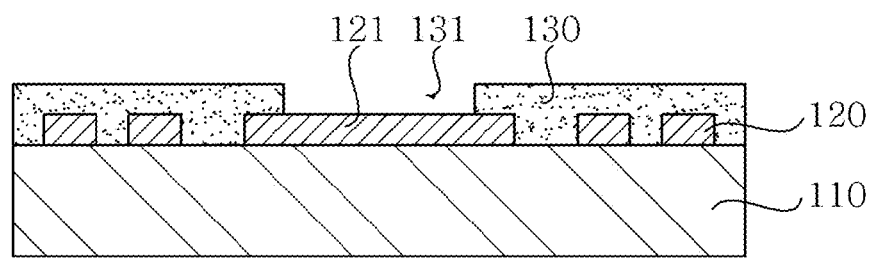

With reference to FIG. 3, the solder resist layer 130 may be formed on an upper portion of the base substrate 110.

When the circuit layer 120 is the outermost layer, the solder resist layer 130 may be formed on the upper portion of the circuit layer 120 in order to prevent the circuit layer 120 from being damaged by soldering, or the like, using solder. The solder resist layer 130 may have a first opening 131 formed to expose the connection pad 121 of the circuit layer 120 to the outside.

Figure 4:
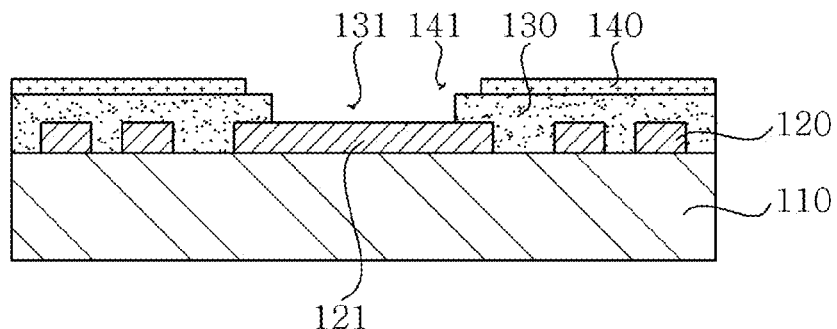

With reference to FIG. 4, a first plated resist layer 140 may be formed on an upper portion of the solder resist layer 130. The first plated resist layer 140 may include a second opening 141 formed to expose the first opening 131. Here, the second opening 141 may be formed at an upper portion of the first opening 131. Also, the diameter of the second opening 141 of the first plated resist layer 140 may be greater than that of the first opening 131. Namely, the first plated resist layer 140 may be formed on an upper portion of the solder resist layer 130 such that the first opening 131 and a portion of the solder resist layer 130 are exposed.

Figure 5:
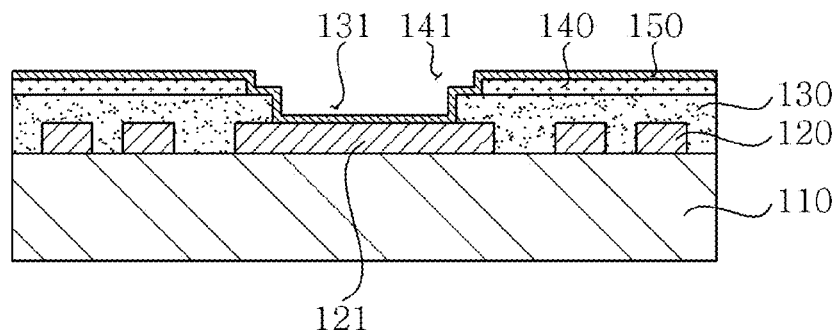

With reference to FIG. 5, the seed layer 150 may be formed on an upper portion of the first plated resist layer 140. The seed layer 150 may be formed on inner walls of the first opening 131 and the second opening 141, as well as on the upper portion of the first plated resist layer 140. The seed layer 150 may be formed through electroless plating. Also, the seed layer 150 may be made of an electrically conductive material.

Figure 6:
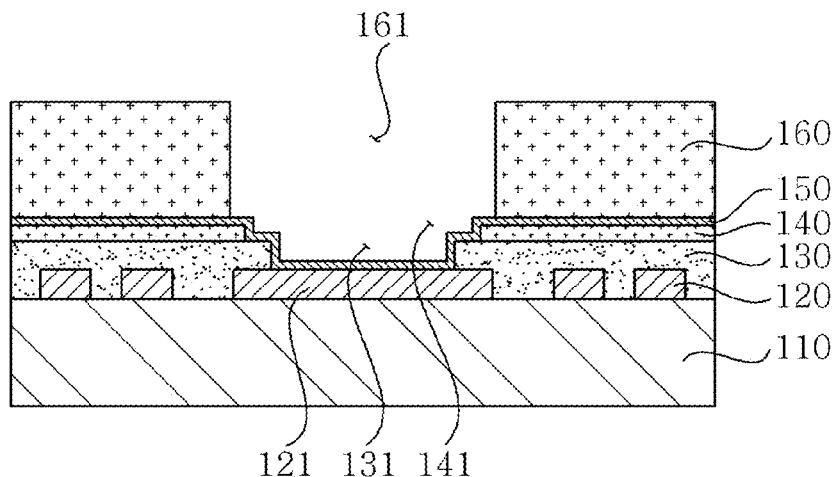

With reference to FIG. 6, a second plated resist layer 160 may be formed on an upper portion of the seed layer 150. The second plated resist layer 160 may include a third opening 161 formed to expose the second opening 141. Here, the third opening 161 may be formed at an upper side of the second opening 141. Also, the diameter of the third opening 161 of the second plated resist layer 160 may be greater than that of the second opening 141.

Figure 7:
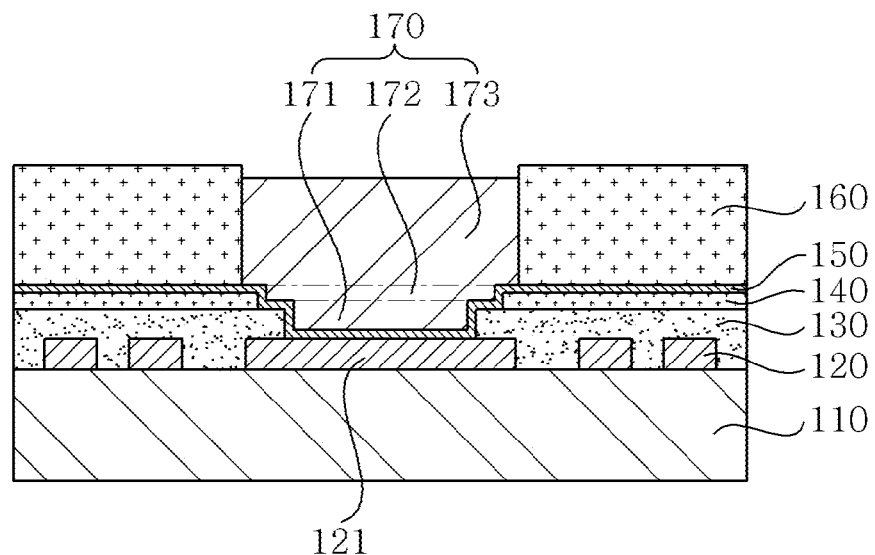

With reference to FIG. 7, the metal post 170 may be formed. The metal post 170 may be formed by filling the interior of the first opening 131 to the third opening 161 formed on the upper portion of the connection pad 121 with electrically conductive metal. The metal post 170 may be formed through electroplating. Also, the metal post 170 may be made of metal such as copper, gold, silver, nickel, or the like, having excellent electrical conductivity. The metal post 170 formed by filling the interior of the first opening 131 to the third opening 161 may include the first post portion 171, the second post portion 172, and the third post portion 173.

The first post portion 171 may be formed within the first opening 131. The second post portion 172 may be formed within the second opening 141. The third post portion 173 may be formed within the third opening 161. Namely, since the third opening 161 is formed to have a diameter greater than that of the second opening 141, the metal post 170 may be formed such that the third post portion 173 has a diameter greater than that of the second post portion 172.

Figure 8:
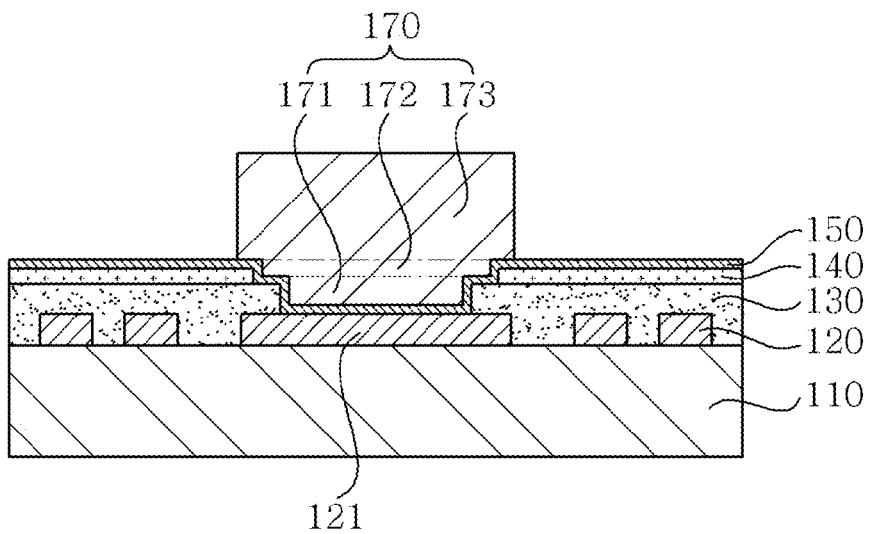

With reference to FIG. 8, the second plated resist layer 160 may be eliminated.

After the metal post 170 is formed, the second plated resist layer 160 including the third opening 161 may be eliminated. The second plated resist layer 160 may be eliminated by a general plated resist elimination method.

Figure 9:
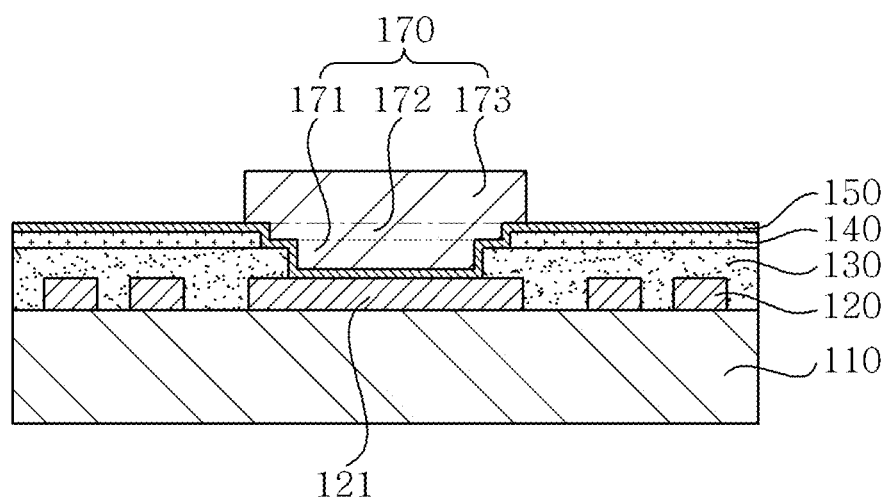

With reference to FIG. 9, the metal post 170 may be planarized.

After the second plated resist layer 160 is eliminated, a polishing process may be performed on the upper portion of the exposed metal post 170. Through the polishing process, a portion of the upper portion of the metal post 170 is polished to form the metal post 170 having a predetermined height. According to a preferred embodiment of the present invention, after the second plated resist layer 160 is eliminated, the metal post 170 is planarized, but the process of performing planarization is not limited thereto. Namely, planarizing of the metal post 170 may be performed after any of the process of eliminating the seed layer and the process of eliminating the first plated resist layer 140 which are performed later by a person skilled in the art.

Figure 10:
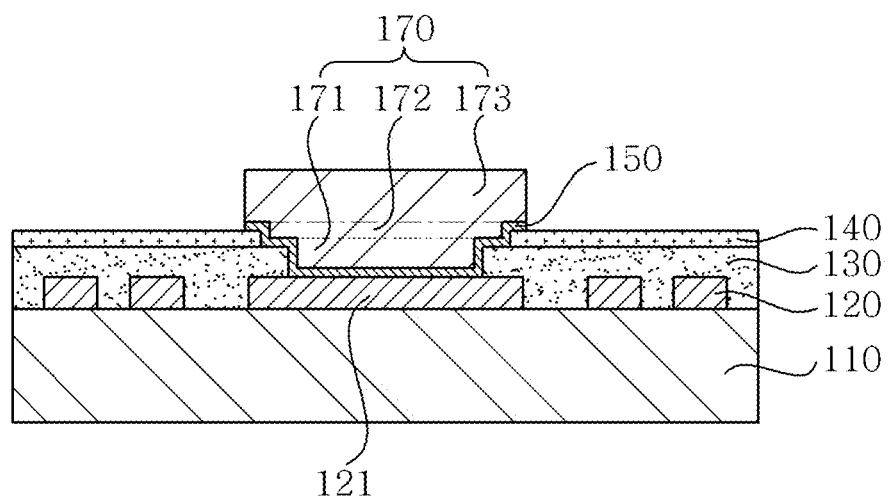

With reference to FIG. 10, the seed layer 150 may be eliminated.

A portion of the seed layer 150 may be exposed through the elimination of the second plated resist layer 160. Thus, the exposed seed layer 150 may be eliminated. The seed layer 150 may be eliminated through a general etching method. For example, the seed layer 150 may be eliminated through a flash etching method.

Figure 11:
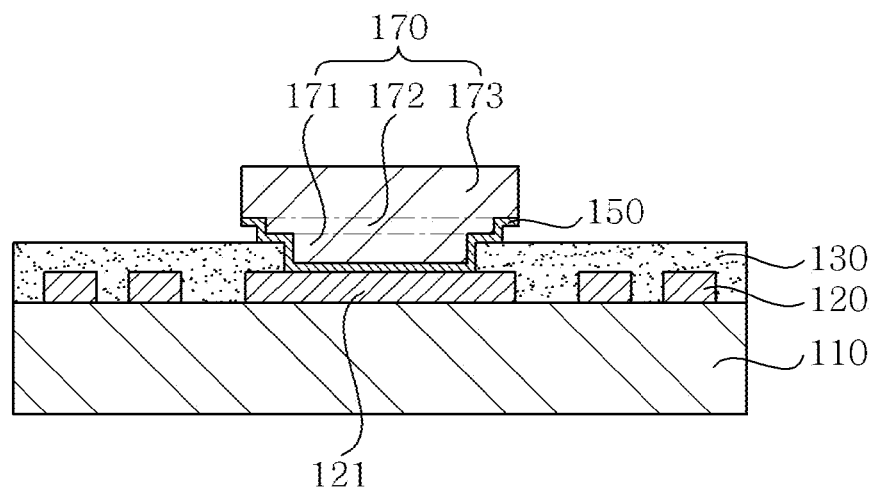

With reference to FIG. 11, the first plated resist layer 140 may be eliminated.

After the seed layer 150 is eliminated, the first plated resist layer 140 may be eliminated. The first plated resist layer 140 may be eliminated through a general plated resist elimination method.

As the first plated resist layer 140 is eliminated, the lower portion of a resulting structure according to the preferred embodiment of the present invention has a stare-like shape, and the PCB including the metal post 170 having a plurality of diameters may be formed. The metal post 170 in which the diameter of the third post portion 173 is greater than that of the second post portion 172 can improve mounting stability of an external element (not shown) such as a semiconductor element, or the like, mounted on an upper portion of the PCB. Also, since the second post portion 172 of the metal post 170 is formed on an upper portion of the solder resist layer 130, a bonding area between the metal post 170 and the solder resist layer 130 can be increased. Since the bonding area between the metal post 170 and the solder resist layer 130 is increased, bonding strength between the metal post 170 and the PCB 100 can be enhanced.

Figure 12:
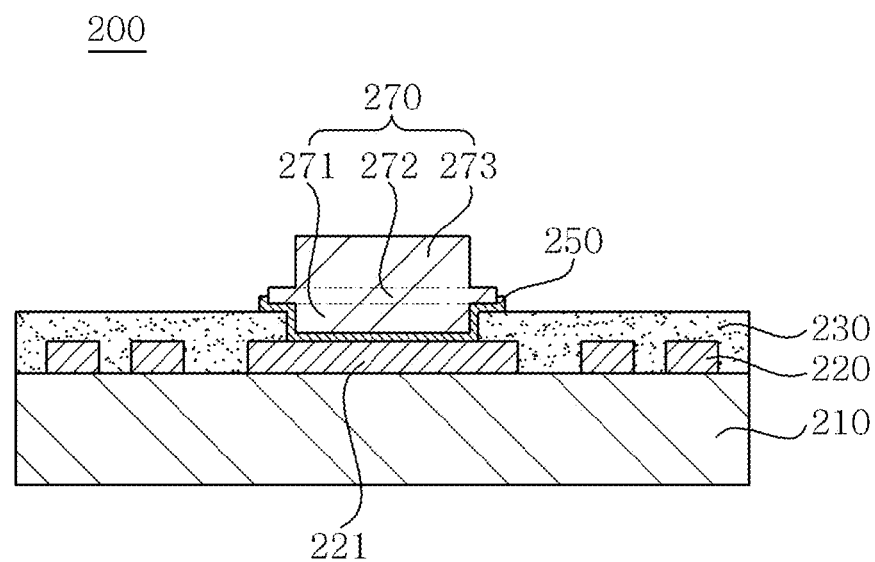
FIG. 12 is a cross-sectional view showing a printed circuit board according to another preferred embodiment of the present invention.

FIG. 12 is a cross-sectional view showing a printed circuit board (PCB) according to another preferred embodiment of the present invention.

With reference to FIG. 12, a PCB 200 may include a base substrate 210, a circuit layer 220, a solder resist layer 230, a seed layer 250, and a metal post 270.

The base substrate 210 may be, for example, a copper clad laminate (CCL). The CCL, which is a raw material plate used for manufacturing a package substrate, refers to a laminate formed by thinly coating copper on a solder resist layer. CCLs may include a glass/epoxy CCL, a heat-resistant CCL, paper/phenol CCL, a high frequency CCL, a flexible CCL (polyimide film), a composite CCL, and the like, according to purposes. Among them, the glass/epoxy CCL is commonly used for a double-sided package substrate and a multilayer package substrate.

The circuit layer 220 is formed at an upper portion of the base substrate 210. The circuit layer 220, configured to transfer an electrical signal, may include a circuit pattern, a via, and a connection pad. The circuit layer 220 may be made of copper, gold, silver, nickel, or the like, having excellent electrical conductivity. According to a preferred embodiment of the present invention, the circuit layer 220 may be formed on the outermost layer.

According to a preferred embodiment of the present invention, the circuit layer 220 is formed as a single layer on an upper portion of the base substrate 210, but the present invention is not limited thereto. Namely, multiple circuit layers may be formed on the base substrate 210. Also, a single circuit layer or multiple circuit layers may be formed on one surface or both surfaces of the base substrate 210.

The solder resist layer 230 may be formed on an upper portion of the circuit layer 220. In order to prevent the circuit layer 220 as the outermost layer from being damaged by soldering, or the like, using solder, the solder resist layer 230 may be formed. The solder resist layer 230 may have an opening formed to allow a connection pad 221 of the circuit layer 220 to be exposed to the outside.

The metal post 270 may be formed on an upper portion of the seed layer 250. The metal post 270 may be formed by filling (or charging) the interior of the opening of the solder resist layer 230, which is formed to expose the connection pad 221, with an electrically conductive metal. For example, the metal post 270 may be made of metal such as copper, gold, silver, nickel, or the like, having excellent electrical conductivity. The metal post 270 may be formed on the upper portion of the seed layer 250 such that a lower portion thereof has a stair-like shape. Namely, the metal post 270 may be formed to have a plurality of diameters. The metal post 270 may include a first post portion 271, a second post portion 272, and a third post portion 273.

The first post portion 271 may be formed within the opening formed in the solder resist layer 230.

The second post portion 272 may be formed at an upper portion of the first post portion 271 and the solder resist layer 230.

The third post portion 273 may be formed on an upper portion of the second post portion 272.

In the metal post 270 formed thusly, at least one of the first post portion 271 to the third post portion 273 may have a diameter having a different size.

According to a preferred embodiment of the present invention, in the metal post 270, the diameter of the second post portion 272 may be greater than that of the third post portion 273.

In this manner, in the metal post 270, since the second post portion 272 is formed on an upper portion of the solder resist layer 230, the bonding area between the metal post 270 and the solder resist layer 230 can be increased. Thus, since the bonding area between the metal post 270 and the solder resist layer 230 is increased, the bonding strength between the metal post 270 and the PCB 200 can be enhanced. Also, since the diameter of the second post portion 272 of the metal post 270 is greater than that of the third post portion 273, a formation of voids between the PCB 200 and an external element (not shown) during an underfill process can be prevented.

The seed layer 250 may be formed between upper portions of the solder resist layer 230 and the connection pad 221 and the lower portion of the metal post 270. The seed layer 250 may be formed on a lower surface of the first portion 271 and the second post portion 272 of the metal post 270. Thus, since the seed layer 250 is formed on the lower surface of the first portion 271 and the second post portion 272 of the metal post 270, the seed layer 250 may be formed to have a step like stairs.

FIGS. 13 through 22 are cross-sectional views sequentially showing a method for manufacturing a PCB according to another preferred embodiment of the present invention.

Figure 13:
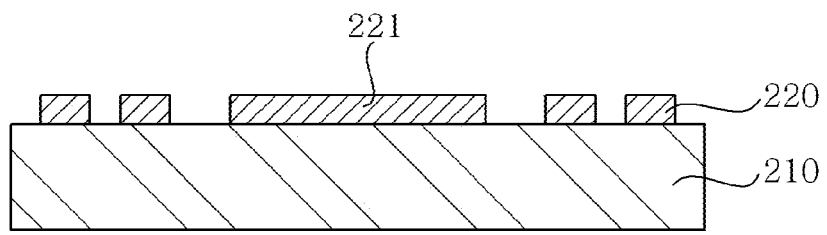
FIGS. 13 through 22 are cross-sectional views sequentially showing a method for manufacturing a PCB according to another preferred embodiment of the present invention.

With reference to FIG. 13, the base substrate 210 with the circuit layer 220 formed thereon may be provided.

The base substrate 210 may be, for example, a copper clad laminate (CCL). The CCL, which is a raw material plate used for manufacturing a package substrate, refers to a laminate formed by thinly coating copper on a solder resist layer. CCLs may include a glass/epoxy CCL, a heat-resistant CCL, paper/phenol CCL, a high frequency CCL, a flexible CCL (polyimide film), a composite CCL, and the like, according to purposes. Among them, the glass/epoxy CCL is commonly used for a double-sided package substrate and a multilayer package substrate.

The circuit layer 220 is formed at an upper portion of the base substrate 210. The circuit layer 220, configured to transfer an electrical signal, may include a circuit pattern, a via, and a connection pad. The circuit layer 220 may be made of copper, gold, silver, nickel, or the like, having excellent electrical conductivity. According to a preferred embodiment of the present invention, the circuit layer 220 may be formed on the outermost layer.

According to a preferred embodiment of the present invention, the circuit layer 220 is formed as a single layer on an upper portion of the base substrate 210, but the present invention is not limited thereto. Namely, multiple circuit layers may be formed on the base substrate 210. Also, a single circuit layer or multiple circuit layers may be formed on one surface or both surfaces of the base substrate 210.

Figure 14:
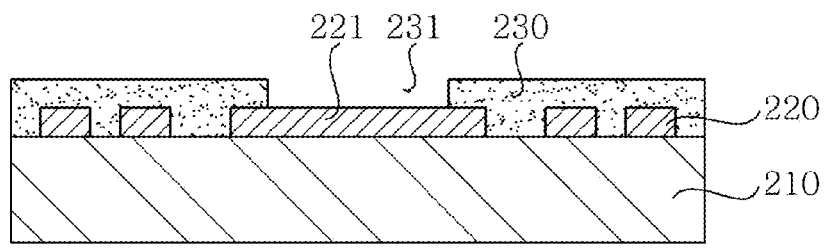

With reference to FIG. 14, the solder resist layer 230 may be formed on an upper portion of the base substrate 210.

When the circuit layer 220 is the outermost layer, the solder resist layer 230 may be formed on the upper portion of the circuit layer 220 in order to prevent the circuit layer 220 from being damaged by soldering, or the like, using solder. The solder resist layer 230 may have a first opening 231 formed to expose the connection pad 221 of the circuit layer 220 to the outside.

Figure 15:
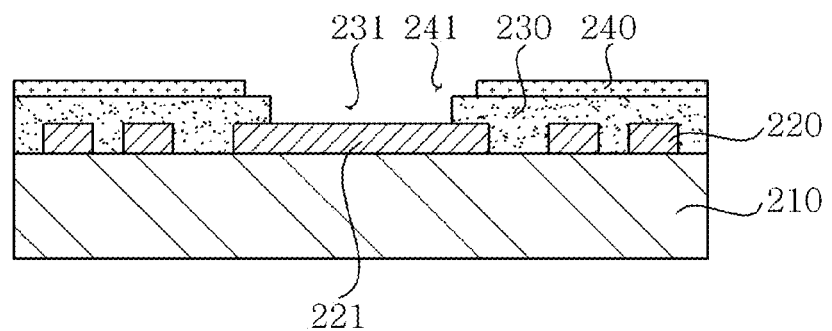

With reference to FIG. 15, a first plated resist layer 240 may be formed on an upper portion of the solder resist layer 230. The first plated resist layer 240 may include a second opening 241 formed to expose the first opening 231. Here, the second opening 241 may be formed at an upper portion of the first opening 231. Also, the diameter of the second opening 241 of the first plated resist layer 240 may be greater than that of the first opening 231. Namely, the first plated resist layer 240 may be formed on an upper portion of the solder resist layer 230 such that the first opening 231 and a portion of the solder resist layer 230 are exposed.

Figure 16:
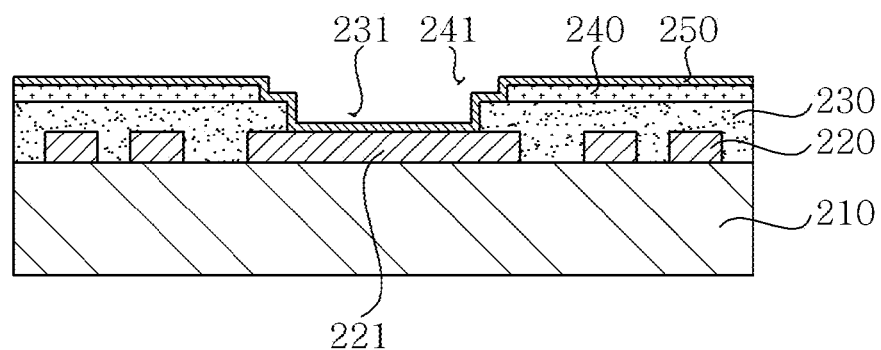

With reference to FIG. 16, the seed layer 250 may be formed on an upper portion of the first plated resist layer 240. The seed layer 250 may be formed on inner walls of the first opening 231 and the second opening 241, as well as on the upper portion of the first plated resist layer 240. The seed layer 250 may be formed through electroless plating. Also, the seed layer 250 may be made of an electrically conductive material.

Figure 17:
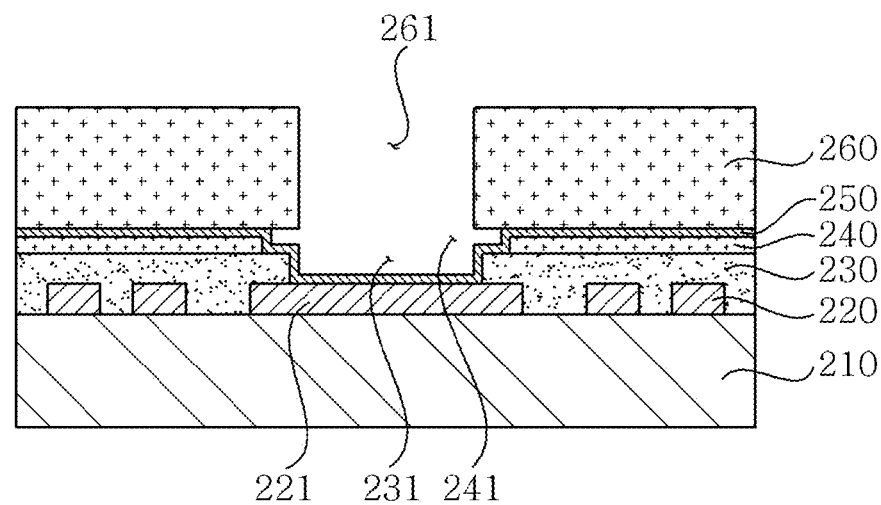

With reference to FIG. 17, a second plated resist layer 260 may be formed on an upper portion of the seed layer 250. The second plated resist layer 260 may include a third opening 261 formed to expose the second opening 241. Here, the third opening 261 may be formed at an upper side of the second opening 241. Also, the diameter of the third opening 261 of the second plated resist layer 260 may be greater than that of the second opening 241.

Figure 18:
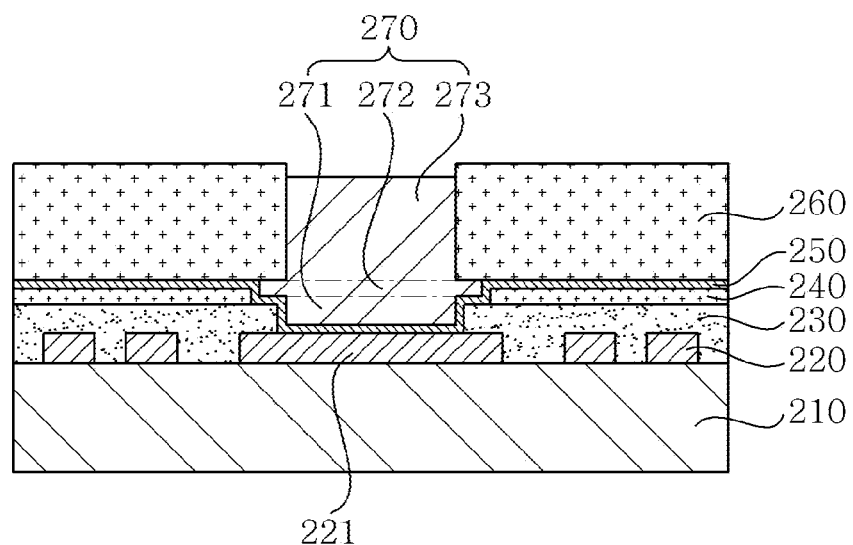

With reference to FIG. 18, the metal post 270 may be formed. The metal post 270 may be formed by filling the interior of the first opening 231 to the third opening 261 formed on the upper portion of the connection pad 221 with electrically conductive metal. The metal post 270 may be formed through electroplating. Also, the metal post 270 may be made of metal such as copper, gold, silver, nickel, or the like, having excellent electrical conductivity. The metal post 270 formed by filling the interior of the first opening 231 to the third opening 261 may include the first post portion 271, the second post portion 272, and the third post portion 273.

The first post portion 271 may be formed within the first opening 231. The second post portion 272 may be formed within the second opening 241. The third post portion 273 may be formed within the third opening 261. Namely, since the second opening 241 is formed to have a diameter greater than that of the third opening 261, the metal post 270 may be formed such that the second post portion 272 has a diameter greater than that of the third post portion 273.

Figure 19:
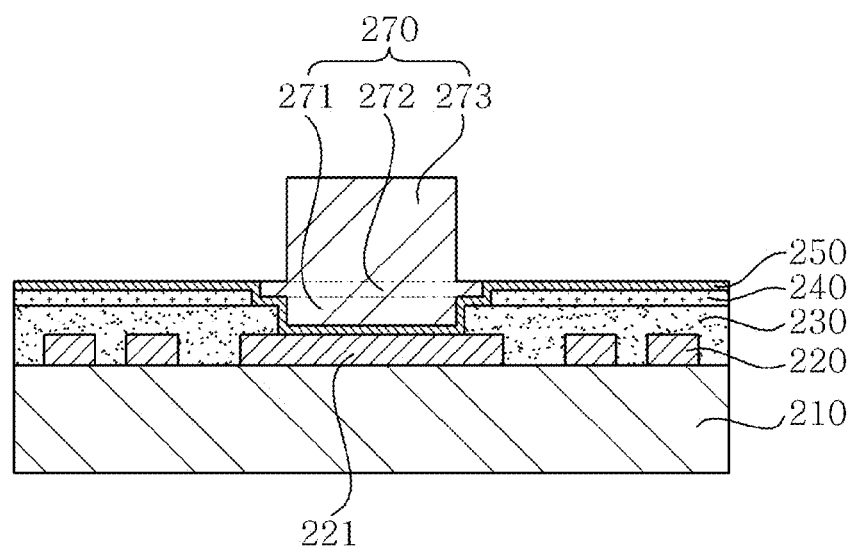

With reference to FIG. 19, the second plated resist layer 260 may be eliminated.

After the metal post 270 is formed, the second plated resist layer 260 including the third opening 261 may be eliminated. The second plated resist layer 260 may be eliminated by a general plated resist elimination method.

Figure 20:
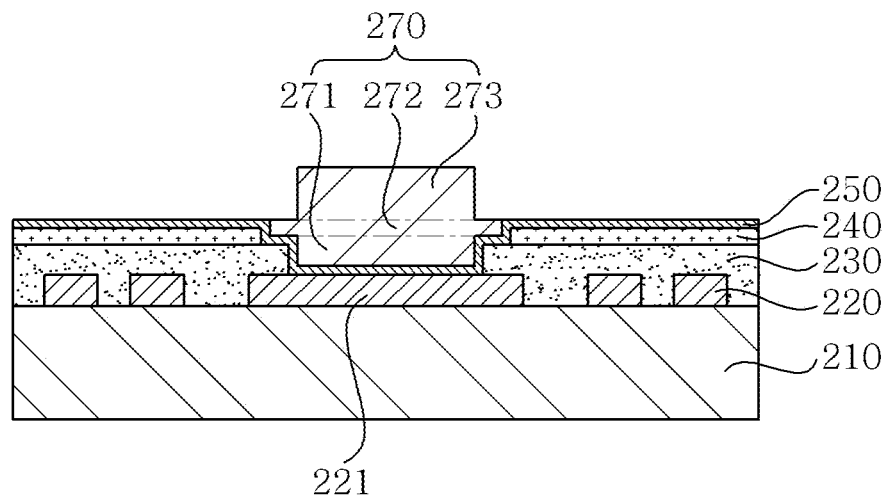

With reference to FIG. 20, the metal post 270 may be planarized.

After the second plated resist layer 260 is eliminated, a polishing process may be performed on the upper portion of the exposed metal post 270. Through the polishing process, a portion of the upper portion of the metal post 270 is polished to form the metal post 270 having a predetermined height. According to a preferred embodiment of the present invention, after the second plated resist layer 160 is eliminated, the metal post 270 is planarized, but the process of performing planarization is not limited thereto. Namely, planarizing of the metal post 270 may be performed after any of the process of eliminating the seed layer 250 and the process of eliminating the first plated resist layer 240 which are performed later by a person skilled in the art.

Figure 21:
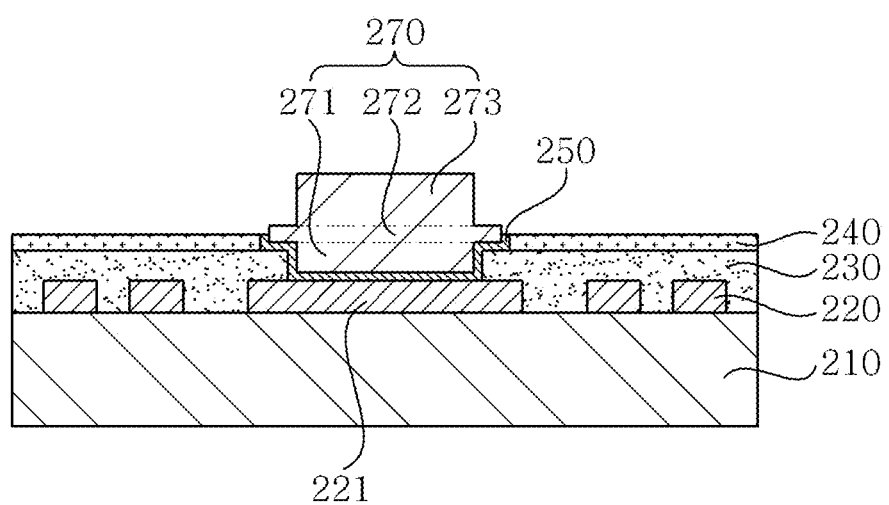

With reference to FIG. 21, the seed layer 250 may be eliminated.

A portion of the seed layer 250 may be exposed through the elimination of the second plated resist layer 260. Thus, the exposed seed layer 250 may be eliminated. The seed layer 250 may be eliminated through a general etching method. For example, the seed layer 250 may be eliminated through a flash etching method.

Figure 22:
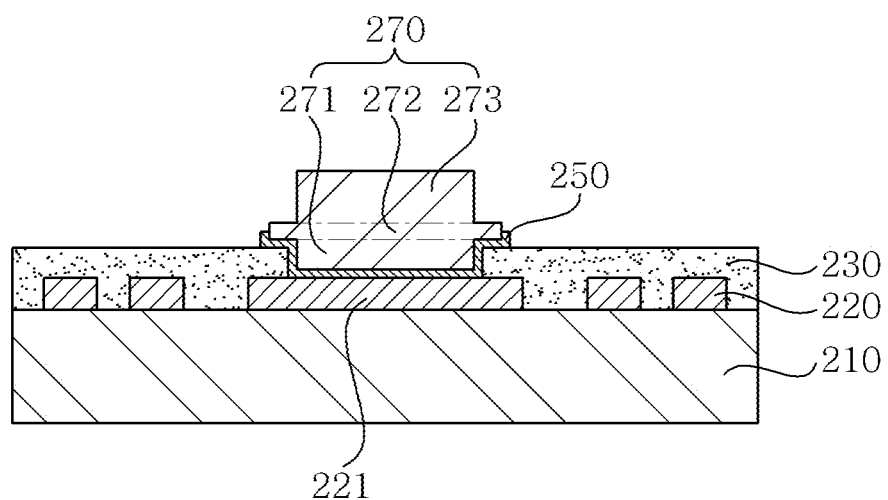

With reference to FIG. 22, the first plated resist layer 240 may be eliminated.

After the seed layer 250 is eliminated, the first plated resist layer 240 may be eliminated. The first plated resist layer 240 may be eliminated through a general plated resist elimination method.

As the first plated resist layer 240 is eliminated, the lower portion of a resulting structure according to the preferred embodiment of the present invention has a stair-like shape, and the PCB (200 in FIG. 12) including the metal post 270 having a plurality of diameters may be formed. Thus, since the second post portion 272 of the metal post 270 is formed on the upper portion of the solder resist layer 230, a bonding area between the metal post 270 and the solder resist layer 230 can be increased. Also, since the bonding area between the metal post 270 and the solder resist layer 230 is increased, bonding strength between the metal post 270 and the PCB (200 in FIG. 12) can be enhanced. Also, since the diameter of the second post portion 272 is greater than that of the third post portion 273, a formation of voids between the PCB 200 and an external element (not shown) during an underfill process can be prevented.

According to the preferred embodiments of the present invention, in the PCB and the method for manufacturing the same, since the upper diameter of the metal post having a plurality of diameters is large, mounting stability of an external element can be enhanced.

According to the preferred embodiments of the present invention, in the PCB and the method for manufacturing the same, since the diameter of the intermediate portion of the metal post is large, a bonding area between the metal post and the solder resist is increased to thereby enhance bonding strength therebetween.

According to the preferred embodiments of the present invention, in the PCB and the method for manufacturing the same, since the diameter of the intermediate portion of the metal post having a plurality of diameters is large, a formation of voids during an underfill process can be prevented.

Although the embodiments of the present invention has been disclosed for illustrative purposes, it will be appreciated that the printed circuit board and the method for manufacturing the same according to the invention are not limited thereto, and those skilled in the art will appreciate that various modifications, additions and substitutions are possible, without departing from the scope and spirit of the invention.

What is claimed is:

1. A printed circuit board (PCB) comprising:
    a base substrate;
    a circuit layer formed on the base substrate and including a connection pad;
    a solder resist layer formed on an upper portion of the base substrate and having an opening exposing the connection pad;
    a metal post formed on upper portions of the exposed connection pad and the solder resist layer and having a plurality of diameters; and
    a seed layer formed on an upper portion of the solder resist layer and inner walls of the opening along an interface of the metal post,
    wherein the metal post comprises:
        a first post portion formed within the opening;
        a second post portion formed on upper portions of the first post portion and the solder resist layer; and
        a third post portion formed on an upper portion of the second post portion,
    wherein, in the metal post, the diameter of the third post portion is smaller than that of the second portion, and
    wherein the seed layer is formed on a lower surface of the first portion, the second post portion, and the third post portion of the metal post, and the seed layer is formed to have at least two steps like stairs.

2. The printed circuit board as set forth in claim 1, wherein the seed layer is formed through electroless plating.

3. The printed circuit board as set forth in claim 1, wherein the metal post is formed through electroplating.

4. A method for manufacturing a printed circuit board (PCB), the method comprising:
- preparing a base substrate on which a circuit layer including a connection pad is formed; forming a solder resist layer having a first opening exposing the connection pad on an upper portion of the base substrate;
- forming a first plated resist layer which has a second opening exposing the first opening and has a diameter greater than that of the first opening on an upper portion of the solder resist layer;
- forming a seed layer on an upper portion of the first plated resist layer, on an inner wall of the first opening, and on an inner wall of the second opening;
- forming a second plated resist layer which has a third opening exposing the first opening on an upper portion of the seed layer;
- plating the interior of the first through third openings to form a metal post;
- eliminating the second plated resist layer; eliminating the seed layer exposed through the elimination of the second plated resist layer; and
- eliminating the first plated resist layer exposed through the elimination of the seed layer.

5. The method as set forth in claim 4, wherein, in the forming of the second plated resist layer, the third opening is formed to have a diameter greater than that of the second opening.

6. The method as set forth in claim 4, wherein, in the forming of the second plated resist layer, the third opening is formed to have a diameter smaller than that of the second opening.

7. The method as set forth in claim 4, wherein, in the forming of the seed layer, the seed layer is formed through electroless plating.

8. The method as set forth in claim 4, wherein, in the forming of the metal post, the metal post is formed through electroplating.

9. The method as set forth in claim 4, further comprising: planarizing the metal post after eliminating the second plated resist layer.

10. The method as set forth in claim 9, wherein, in the planarizing of the metal post, the metal post is planarized through a polishing process.

* * * * *